US012642148B2

(12) United States Patent
Kim et al.

(10) Patent No.: US 12,642,148 B2
(45) Date of Patent: May 26, 2026

(54) SEMICONDUCTOR PACKAGE INCLUDING REDISTRIBUTION STRUCTURE AND METHOD FOR MANUFACTURING THE SAME

(71) Applicant: Samsung Electronics Co., Ltd., Suwon-si (KR)

(72) Inventors: Jongyoun Kim, Seoul (KR); Minjung Kim, Cheonan-si (KR); Gwangjae Jeon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 748 days.

(21) Appl. No.: 17/714,490

(22) Filed: Apr. 6, 2022

(65) Prior Publication Data

US 2023/0025903 A1 Jan. 26, 2023

(30) Foreign Application Priority Data

Jul. 15, 2021 (KR) ........................ 10-2021-0092831

(51) Int. Cl.
*H10W 90/00* (2026.01)
*H10W 70/685* (2026.01)
(Continued)

(52) U.S. Cl.
CPC ....... *H10W 90/701* (2026.01); *H10W 70/685* (2026.01); *H10W 74/131* (2026.01);
(Continued)

(58) Field of Classification Search
CPC ......... H01L 24/13; H01L 24/11; H01L 24/05; H01L 2224/0401; H01L 23/3128;
(Continued)

(56) References Cited

U.S. PATENT DOCUMENTS 7,323,406 B2 1/2008 Lim et al.
8,183,147 B2 5/2012 Koike
(Continued)

FOREIGN PATENT DOCUMENTS

KR 10-2019-0141472 A 12/2019
KR 10-2020-0031202 A 3/2020
KR 10-2021-0001773 A 1/2021

OTHER PUBLICATIONS

Office Action for Korean Application No. 10-2021-0092831 dated Jul. 25, 2025.

*Primary Examiner* — Jessica S Manno
*Assistant Examiner* — Victor Joseph Lasasso
(74) *Attorney, Agent, or Firm* — Harness, Dickey & Pierce, P.L.C.

(57) ABSTRACT

A semiconductor package according to the disclosure includes a terminal, a conductive pattern connected to the terminal, a barrier layer covering a top surface and a first side wall of the conductive pattern, an insulating layer surrounding the barrier layer, a protection layer covering a bottom surface of the insulating layer and a bottom surface of the barrier layer, a redistribution pattern connected to the barrier layer, a semiconductor chip electrically connected to the redistribution pattern, and a molding layer surrounding the semiconductor chip. A top surface of the protection layer includes a first portion contacting the conductive pattern, and a second portion contacting the barrier layer.

16 Claims, 11 Drawing Sheets

(51) Int. Cl.
H10W 74/10 (2026.01)
H10W 74/15 (2026.01)

(52) U.S. Cl.
CPC ............ *H10W 74/15* (2026.01); *H10W 90/00*
(2026.01); *H10W 90/724* (2026.01); *H10W*
*90/734* (2026.01)

(58) Field of Classification Search
CPC ..... H01L 23/49816; H01L 2224/32225; H01L
24/03; H01L 2224/16225; H01L
2224/73204; H01L 21/02645; H01L
21/56; H01L 21/76804; H01L 21/76807;
H01L 24/19; H10W 90/00; H10W 72/29;
H10W 90/724; H10W 72/252; H10W
72/241; H10W 90/722; H10P 54/00;
H10P 72/74; H10P 72/744; H10P
14/69433; H10P 72/7402; H10P 72/743

See application file for complete search history.

(56) References Cited

U.S. PATENT DOCUMENTS

| | | | |
|---|---|---|---|
| 9,520,350 | B2 | 12/2016 | Teh et al. |
| 10,276,402 | B2 | 4/2019 | Chen et al. |
| 10,283,473 | B1 | 5/2019 | Yu et al. |
| 10,290,604 | B2 | 5/2019 | Huang et al. |
| 10,861,814 | B2 | 12/2020 | Lee et al. |
| 2008/0157330 | A1* | 7/2008 | Kroehnert ............... H01L 23/13 |
| | | | 257/E23.19 |
| 2010/0078819 | A1* | 4/2010 | Shin ...................... H01L 23/525 |
| | | | 438/653 |
| 2010/0140752 | A1* | 6/2010 | Marimuthu ........... H01L 23/481 |
| | | | 257/E29.112 |
| 2014/0264875 | A1* | 9/2014 | Kanki ............... H01L 23/49827 |
| | | | 438/643 |
| 2016/0218082 | A1* | 7/2016 | Lee ..................... H01L 23/5389 |
| 2019/0067086 | A1* | 2/2019 | Liu ..................... H01L 23/3114 |
| 2019/0386051 | A1 | 12/2019 | Hong et al. |
| 2020/0091066 | A1 | 3/2020 | Kim et al. |
| 2020/0144076 | A1 | 5/2020 | Kang et al. |
| 2020/0343183 | A1* | 10/2020 | Chen .................. H01L 21/6835 |
| 2020/0411458 | A1 | 12/2020 | Kim et al. |

* cited by examiner

SEMICONDUCTOR PACKAGE INCLUDING REDISTRIBUTION STRUCTURE AND METHOD FOR MANUFACTURING THE SAME

CROSS-REFERENCE TO THE RELATED APPLICATION

This application claims priority from Korean Patent Application No. 10-2021-0092831, filed on Jul. 15, 2021, in the Korean Intellectual Property Office, the disclosure of which is incorporated herein by reference in its entirety.

BACKGROUND

1. Field

The example embodiments of the disclosure relate to a semiconductor package and a method for manufacturing the same. In particular, the example embodiments of the disclosure relate to a semiconductor package including a redistribution structure and a method for manufacturing the same.

2. Description of the Related Art

In accordance with advances in electronic industries and user demand, electronic appliances are being further miniaturized and/or lightened, and semiconductor packages used in such electronic appliances are being required to achieve higher performance and/or a large capacity as well as miniaturization and/or lightness. In order to achieve higher performance and/or a larger capacity as well as miniaturization and/or lightness in such semiconductor packages, research and development are being continuously conducted on a semiconductor package including a redistribution structure.

SUMMARY

The example embodiments of the disclosure provide a semiconductor package having enhanced reliability.

A semiconductor package according to some example embodiments of the disclosure may include a terminal, a conductive pattern connected to the terminal, a barrier layer covering a top surface and a first side wall of the conductive pattern, an insulating layer surrounding the barrier layer, a protection layer covering a bottom surface of the insulating layer and a bottom surface of the barrier layer, a redistribution pattern connected to the barrier layer, a semiconductor chip electrically connected to the redistribution pattern, and a molding layer surrounding the semiconductor chip. A top surface of the protection layer may include a first portion contacting the conductive pattern, and a second portion contacting the barrier layer.

A semiconductor package according to some example embodiments of the disclosure may include a protection layer, a conductive pattern extending through the protection layer, a barrier layer covering a top surface and a side wall of the conductive pattern, an insulating layer on the protection layer, and a redistribution pattern connected to the barrier layer. The protection layer may include an overlap portion overlapping with the conductive pattern.

A semiconductor package according to some example embodiments of the disclosure may include a first terminal, a first conductive pattern connected to the first terminal, a first barrier layer surrounding the first conductive pattern, a first insulating layer covering the first barrier layer, a first protection layer covering a bottom surface of the first barrier layer and a bottom surface of the first insulating layer, a first redistribution pattern connected to the first barrier layer, and a first semiconductor chip electrically connected to the first redistribution pattern. The first barrier layer may include a first cover portion covering a top surface and a side wall of the first conductive pattern, and a first protrusion portion protruding from the first cover portion. An outer side wall of the first cover portion and an outer side wall of the first protrusion portion may be spaced apart from each other.

A method for manufacturing a semiconductor package in accordance with some example embodiments of the disclosure may include forming a seed layer, forming a protection layer on the seed layer, forming a first opening at the protection layer, forming, on the protection layer, a first photoresist pattern including a second opening, forming a conductive pattern filling the first and second openings, removing the first photoresist pattern, and forming a barrier layer covering the conductive pattern.

BRIEF DESCRIPTION OF THE DRAWINGS

FIG. 1B is an enlarged view of a portion A of FIG. 1A.

FIGS. 2A, 2B, 2C, 2D, 2E, 2F, 2G, 2H, and 2I are sectional views explaining a method for manufacturing the semiconductor package according to FIG. 1A.

DETAILED DESCRIPTION OF EXAMPLE EMBODIMENTS

Figure 1A:
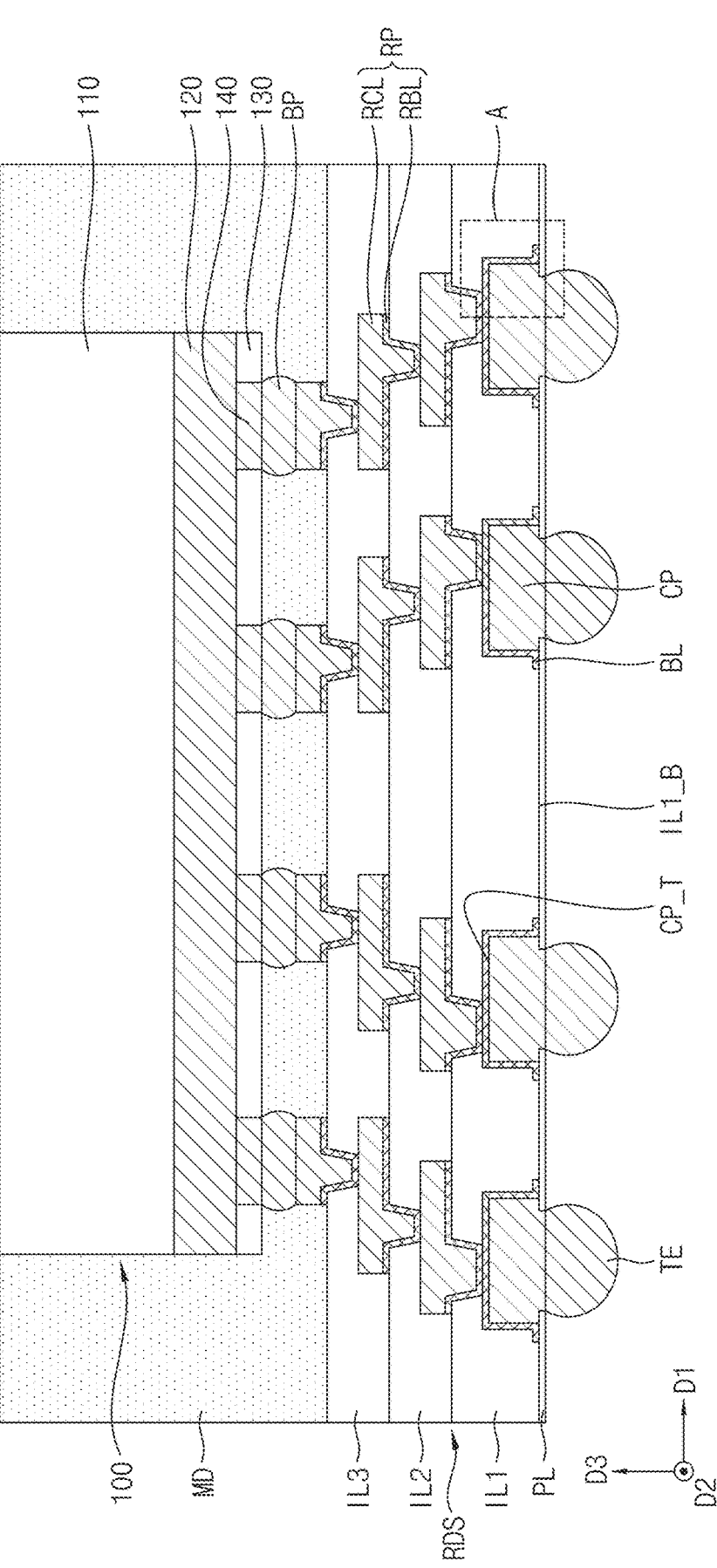
FIG. 1A is a sectional view of a semiconductor package according to some example embodiments of the disclosure.
Figure 1B:
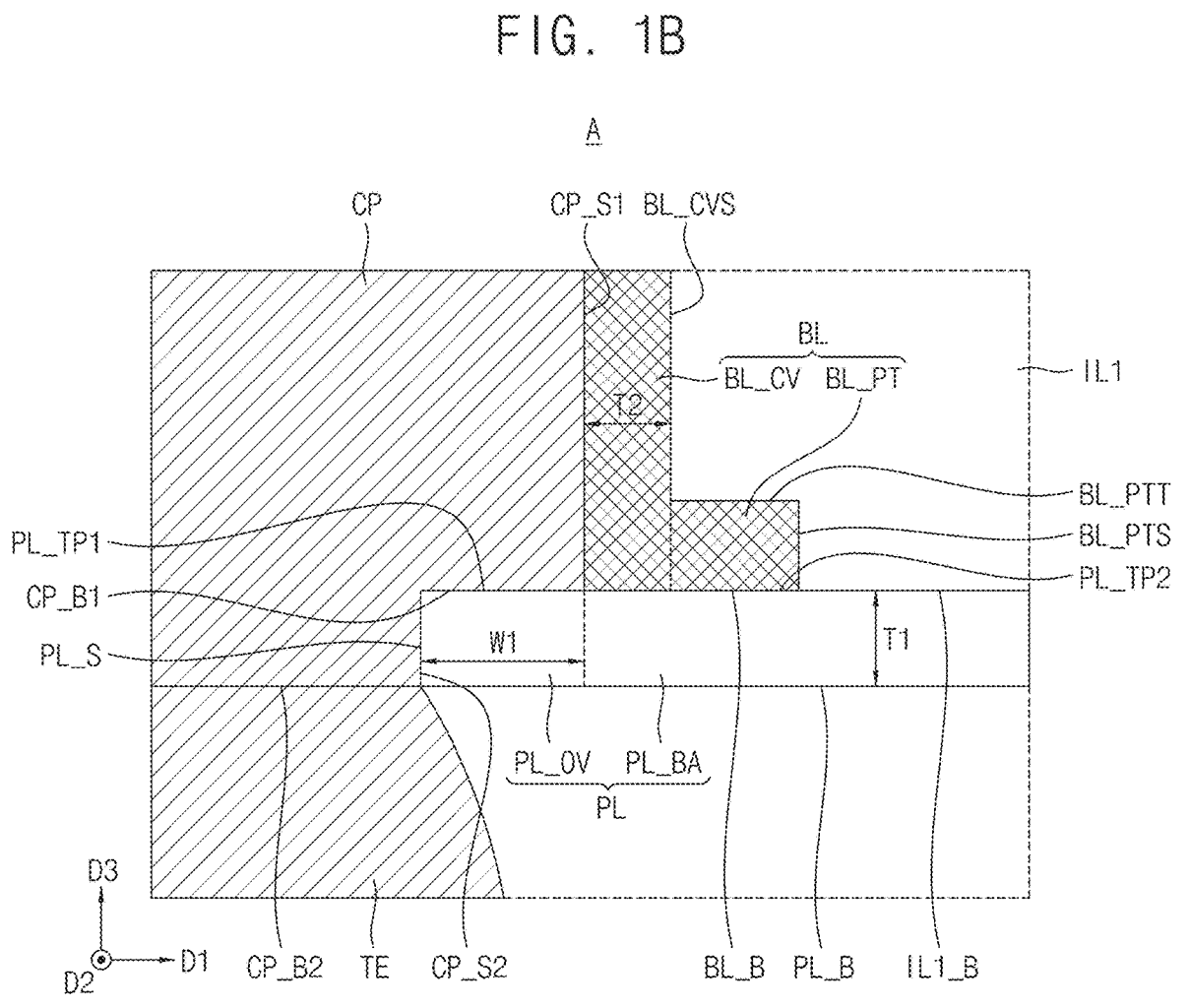

FIG. 1A is a sectional view of a semiconductor package according to some example embodiments of the disclosure. FIG. 1B is an enlarged view of a portion A of FIG. 1A.

Referring to FIGS. 1A and 1B, the semiconductor package may include terminals TE, a redistribution structure RDS, a semiconductor chip 100, bumps BP, and/or a molding layer MD.

The redistribution structure RDS may include a protection layer PL, conductive patterns CP, barrier layers BL, a first insulating layer IL1, a second insulting layer IL2, a third insulating layer IL3, and/or redistribution patterns RP.

The second insulating layer LI2 may be provided on the first insulating layer IL1, and the third insulating layer IL3 may be provided on the second insulating layer IL2. The first to third insulating layers IL1, IL2 and IL3 may include an insulating material. For example, the first to third insulating layers IL1, IL2 and IL3 may include a photoimageable dielectric (PID). Each of the first to third insulating layers IL1, IL2 and IL3 may have the form of a plate extending along a plane defined by a first direction D1 and a second direction D2. The first direction D1 and the second direction D2 may intersect each other. For example, the first direction D1 and the second direction D21 may perpendicularly intersect each other.

Although the redistribution structure RDS is shown and described as including three insulating layers IL1, IL2 and IL3, the example embodiments of the disclosure are not limited thereto. In some example embodiments, the number of insulating layers may be 2 or less, or may be 4 or more.

The protection layer PL may cover a bottom surface BL_B of the barrier layer BL and a bottom surface IL1_B of the first insulating layer IL1. The first insulating layer IL1 may be provided on the protection layer PL. In some example embodiments, the protection layer PL may include the same material as the first to third insulating layers IL1, IL2 and IL3. In some example embodiments, the protection layer PL may include a photoimageable dielectric (PID). In some example embodiments, the protection layer PL may include a material different from that of the first to third insulating layers IL1, IL2 and IL3. In some example embodiments, the protection layer PL may include a non-photoimageable dielectric such as silicon oxide or silicon nitride.

The barrier layer BL may be surrounded by the first insulating layer IL1, The barrier layer BL may be covered by the first insulating layer IL1. The barrier layer BL may be disposed in the first insulating layer IL1. The barrier layer BL may be disposed on the protection layer PL. The barrier layer BL may include a conductive material. For example, the barrier layer BL may include titanium, tantalum, titanium oxide, tantalum oxide, titanium nitride, or tantalum nitride.

The conductive pattern CP may be surrounded by the barrier layer BL. The conductive pattern CP may be surrounded by the first insulating layer IL1. The barrier layer BL may be interposed between the conductive pattern CP and the first insulating layer IL1. The barrier layer BL may conformally cover the conductive pattern CP. The barrier layer BL may cover a top surface CP_T and a first side wall CP_S1 of the conductive pattern CP. The conductive pattern CP may extend through the protection layer PL. The conductive pattern CP may include a conductive material different from that of the barrier layer BL. For example, the conductive pattern CP may include copper.

The terminal TE may be connected to the conductive pattern CP. The terminal TE may contact the conductive pattern CP. The terminal TE may include a conductive material. The semiconductor package may be mounted on an external device (for example, a main board) via the terminals TE.

The redistribution patterns RP may be electrically connected to the terminal TE, the conductive pattern CP, and/or the barrier layer BL. Some of the redistribution patterns RP may be disposed between the first and second insulating layers IL1 and IL2. Some of the redistribution patterns RP may be disposed between the second and third insulating layers IL2 and IL3. Some of the redistribution patterns RP may be disposed on the third insulating layer IL3. The redistribution pattern RP disposed between the first and second insulating layers IL1 and IL2 may be connected to the barrier layer BL. The redistribution pattern RP disposed between the second and third insulating layers IL2 and IL3 may be connected to the redistribution pattern RP disposed between the first and second insulating layers IL1 and IL2 and the redistribution pattern RP disposed on the third insulating layer IL3.

Each of the redistribution patterns RP may include a via portion and a flat portion. The flat portion may be a portion disposed on each of the first to third insulating layers IL1, IL2 and IL3, and the via portion may be a portion protruding from the flat portion in a downward direction (that is, in a direction opposite to a third direction D3). The third direction D3 may intersect the first direction D1 and the second direction D2. For example, the third direction D3 may perpendicularly intersect the first direction D1 and the second direction D2. The via portion of the redistribution pattern RP may extend through a portion of one of the first to third insulating layers IL1, IL2 and IL3.

Each of the redistribution patterns RP may include a redistribution barrier layer RBL and a redistribution conductive layer RCL. The redistribution conductive layer RCL may be provided on the redistribution barrier layer RBL. The redistribution barrier layer RBL may conformally cover a bottom surface of the redistribution conductive layer RCL. The redistribution barrier layer RBL of the redistribution pattern RP disposed between the first and second insulating layers IL1 and IL2 may contact the barrier layer BL. The redistribution conductive layer RCL and the redistribution barrier layer RBL may include different conductive materials, respectively. For example, the redistribution conductive layer RCL may include copper, and the redistribution barrier layer RBL may include titanium or tantalum.

The bumps BP may be provided on the redistribution patterns RP disposed on the third insulating layer IL3, respectively. The bump BP may be connected to the redistribution pattern RP. The bumps BP may include a conductive material.

The semiconductor chip 100 may be provided on the bumps BP. The semiconductor chip 100 may be connected to the bumps BP. The semiconductor chip 100 may include a substrate 110, a wiring structure 120, a passivation layer 130, and/or pads 140. In some example embodiments, the semiconductor chip 100 may include a memory device, a logic device, or an image sensor device.

The substrate 110 may have the form of a plate extending along a plane defined by the first direction D1 and the second direction D2. In some example embodiments, the substrate 110 may be a semiconductor substrate. In some example embodiments, the substrate 110 may be a silicon, germanium, silicon-germanium, GaP, or GaAs substrate. In some example embodiments, the substrate 110 may be a silicon-on-insulator (SOI) substrate or a germanium-on-insulator (GOI) substrate.

The substrate 110 may be provided on the wiring structure 120. The wiring structure 120 may include wirings, and an insulating layer surrounding the wirings. The wirings of the wiring structure 120 may include a conductive material.

The wiring structure 120 may be provided on the passivation layer 130. The passivation layer 130 may function to protect the wiring structure 120. The passivation layer 130 may cover a bottom surface of the wiring structure 120. The passivation layer 130 may include an insulating material.

The pads 140 may extend through the passivation layer 130. The pads 140 may be connected to the bumps BP, respectively. The pads 140 may be connected to the wirings of the wiring structure 120. The pads 140 may include a conductive material.

The semiconductor chip 100, the bumps BP, the redistribution patterns RP, the barrier layers BL, the conductive patterns CP, and/or the terminals TE may be electrically interconnected.

The molding layer MD, which surrounds the semiconductor chip 100, may be provided. The molding layer MD may surround the bumps BP. The molding layer MD may be provided on the third insulating layer IL3 of the redistribution structure RDS. The molding layer MD may include a polymer material. For example, the molding layer MD may include an epoxy resin.

Referring to FIG. 1B, a top surface of the protection layer PL may include a first portion PL_TP1 contacting the conductive pattern CP, and a second portion PL_TP2 contacting the bottom surface BL_B of the barrier layer BL. The protection layer PL may include a side wall PL_S contacting the conductive pattern CP. The side wall PL_S of the protection layer PL may be connected to the first portion PL_TP1 of the top surface of the protection layer PL.

The conductive pattern CP may include a first side wall CP_S1 contacting the barrier layer BL, a first bottom surface CP_B1 contacting the first portion PL_TP1 of the top surface of the protection layer PL, a second side wall CP_S2 contacting the side wall PL_S of the protection layer PL, and a second bottom surface CP_B2 contacting the terminal TE. The first bottom surface CP_B1 and the second bottom surface CP_B2 of the conductive pattern CP may be spaced apart from each other in the third direction D3. The second side wall CP_S2 of the conductive pattern CP may interconnect the first bottom surface CP_B1 and the second bottom surface CP_B2 of the conductive pattern CP. The second bottom surface CP_B2 of the conductive pattern CP may be coplanar with the bottom surface PL_B of the protection layer PL. The level of the first bottom surface CP_B1 of the conductive pattern CP may be higher than the level of the second bottom surface CP_B2 of the conductive pattern CP. The first side wall CP_S1 and the second side wall CP_S2 of the conductive pattern CP may be spaced apart from each other. For example, the first side wall CP_S1 and the second side wall CP_S2 of the conductive pattern CP may be spaced apart from each other in the first direction D1.

The protection layer PL may include a base portion PL_BA and overlap portions PL_OV. The overlap portions PL_OV of the protection layer PL may overlap with the conductive patterns CP in the third direction D3, respectively. For example, the overlap portions PL_OV of the protection layer PL may vertically overlap with the conductive patterns CP, respectively. The base portion PL_BA of the protection layer PL may contact the bottom surface BL_B of the barrier layer BL and the bottom surface IL1_B of the first insulating layer IL1. The overlap portion PL_OV of the protection layer PL may contact the first bottom surface CP_B1 and the second side wall CP_S2 of the conductive pattern CP. The base portion PL_BA of the protection layer PL may define the second portion PL_TP2 of the top surface of the protection layer PL. The overlap portion PL_OV of the protection layer PL may define the first portion PL_TP1 of the top surface of the protection layer PL and the side wall PL_S of the protection layer PL. A top surface of the overlap portion PL_OV of the protection layer PL may be the first portion PL_TP1 of the top surface of the protection layer PL. A side wall of the overlap portion PL_OV of the protection layer PL may be the side wall PL_S of the protection layer PL.

The barrier layer BL may include a cover portion BL_CV and a protrusion portion BL_PT. The cover portion BL_CV of the barrier layer BL may be a portion covering the top surface CP_T and the first side wall CP_S1 of the conductive pattern CP. The protrusion portion BL_PT of the barrier layer BL may be a portion protruding from the cover portion BL_CV of the barrier layer BL. For example, the protrusion portion BL_PT of the barrier layer BL may protrude from the cover portion BL_CV of the barrier layer BL in the first direction D1. The protrusion portion BL_PT of the barrier layer BL may contact the second portion PL_TP2 of the top surface of the protection layer PL. An outer side wall BL_CVS of the cover portion BL_CV of the barrier layer BL and an outer side wall BL_PTS of the protrusion portion BL_PT of the barrier layer BL may be spaced apart from each other. For example, the outer side wall BL_CVS of the cover portion BL_CV of the barrier layer BL and the outer side wall BL_PTS of the protrusion portion BL_PT of the barrier layer BL may be spaced apart from each other in the first direction D1. A top surface BL_PTT of the protrusion portion BL_PT of the barrier layer BL may interconnect the outer side wall BL_CVS of the cover portion BL_CV of the barrier layer BL and the outer side wall BL_PTS of the protrusion portion BL_PT of the barrier layer BL. A portion of the conductive pattern CP overlapping with the overlap portion PL_OV of the protection layer PL may contact the cover portion BL_CV of the barrier layer BL.

The width of the overlap portion PL_OV of the protection layer PL in the first direction D1 may be defined as a first width W1. The first width W1 may be 0.5 to 3 μm. For example, the first width W1 may be 2.5 μm. The width of the first bottom surface CP_B1 of the conductive pattern CP in the first direction D1 may be equal to the first width W1. The width of the first portion PL_TP1 of the top surface of the protection layer PL in the first direction D1 may be equal to the first width W1.

The width of the protrusion portion BL_PT of the barrier layer BL in the first direction D1 may be defined as a second width W2. The second width W2 may be 0.5 to 3 μm. For example, the second width W2 may be 2.5 μm. The width of the top surface BL_PTT of the protrusion portion BL_PT of the barrier layer BL in the first direction D1 may be equal to the second width W2.

A thickness T1 of the protection layer PL may be smaller than the first width W1. For example, the thickness T1 of the protection layer PL may be 0.1 to 0.3 μm. A thickness T2 of the barrier layer BL may be smaller than the second width W2. For example, the thickness T2 of the barrier layer BL may be 0.1 to 0.3 μm.

The semiconductor package according to the example embodiments of the disclosure may include the protection layer PL covering the bottom surface BL_B of the barrier layer BL and, as such, the barrier layer BL may be protected. Accordingly, it may be possible to reduce or prevent a phenomenon in which the conductive pattern CP is peeled off due to loss of the barrier layer BL.

FIGS. 2A, 2B, 2C, 2D, 2E, 2F, 2G, 2H, and 2I are sectional views explaining a method for manufacturing the semiconductor package according to FIGS. 1A and 1B.

Figure 2A:
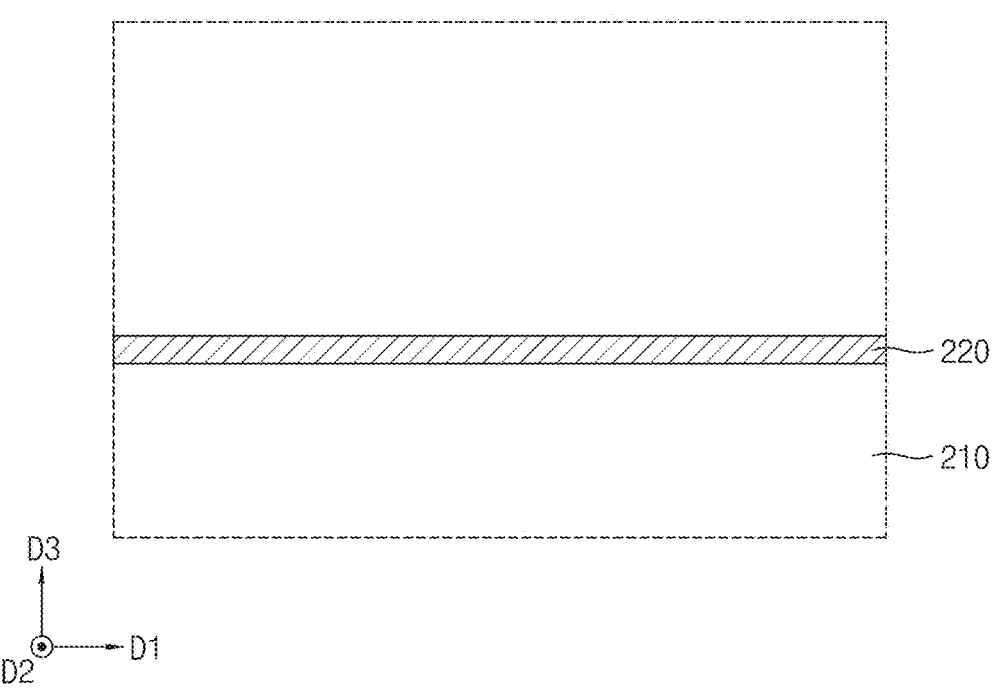

Referring to FIG. 2A, a seed layer 220 may be formed on a carrier substrate 210. The seed layer 220 may function as a seed in a subsequent process. The seed layer 220 may include a conductive material.

Figure 2B:
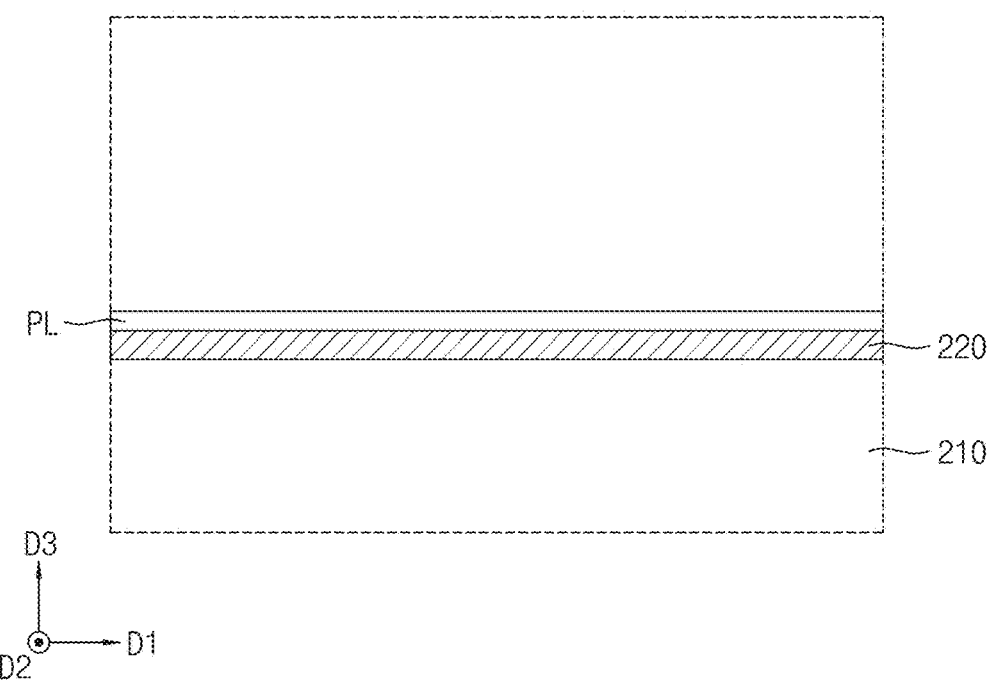

Referring to FIG. 2B, a protection layer PL may be formed on the seed layer 220.

Figure 2C:
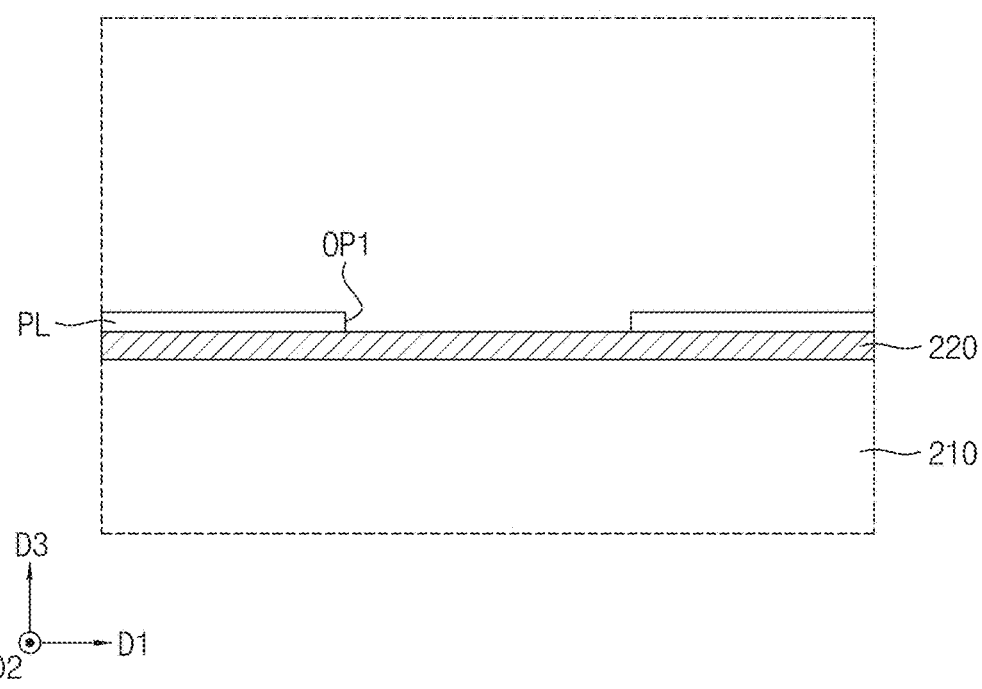

Referring to FIG. 2C, the protection layer PL may be patterned, thereby forming a first opening OP1 at the protection layer PL. In some example embodiments, when the protection layer PL includes a photoimageable dielectric (PID), the first opening OP1 may be formed through exposure and development of the protection layer PL. In some example embodiments, when the protection layer PL includes a non-photoimageable dielectric, the first opening OP1 may be formed by performing an etching process using a photoresist pattern as an etch mask. The first opening OP1 of the protection layer PL may expose the seed layer 220.

Figure 2D:
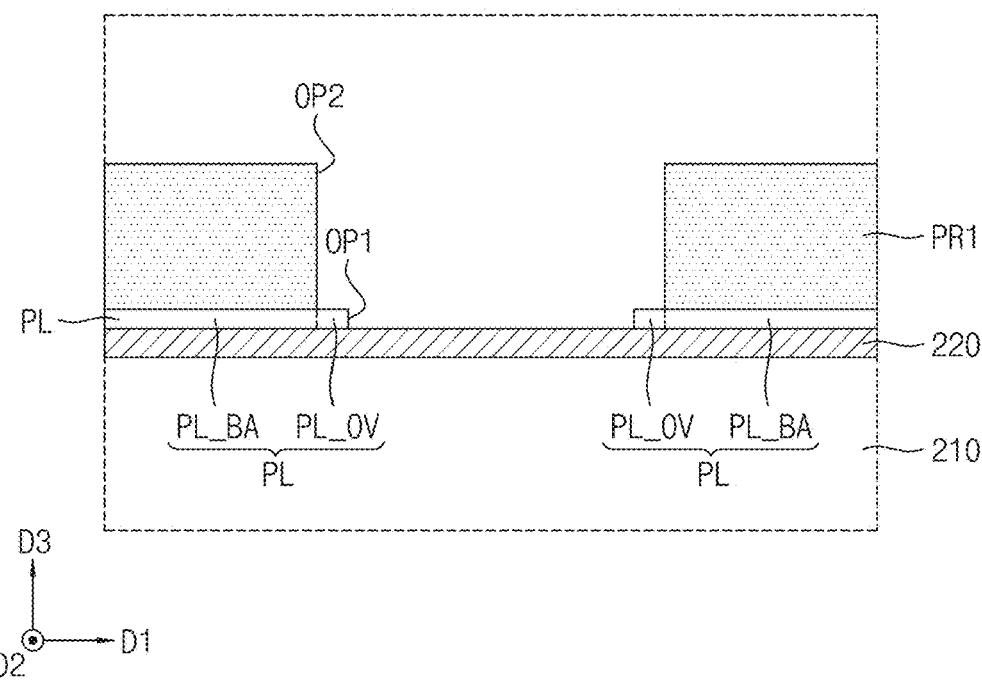

Referring to FIG. 2D, a first photoresist pattern PR1 may be formed on the protection layer PL. The first photoresist pattern PR1 may include a second opening OP2. The width of the second opening OP2 may be greater than the width of the first opening OP1. For example, the width of the second opening OP2 in a first direction D1 may be greater than the width of the first opening OP1 in the first direction D1. A top surface and a side wall of an overlap portion PL_OV of the protection layer PL may be exposed by the second opening OP2 of the first photoresist pattern PR1. A top surface of a base portion PL_BA of the protection layer BL may be covered by the first photoresist pattern PR1. The first photoresist pattern PR1 may overlap with the base portion PL_BA of the protection layer PL in a third direction D3. The overlap portion PL_OV of the protection layer PL may overlap with a portion of the second opening OP2 of the first photoresist pattern PR1 in the third direction D3.

Figure 2E:
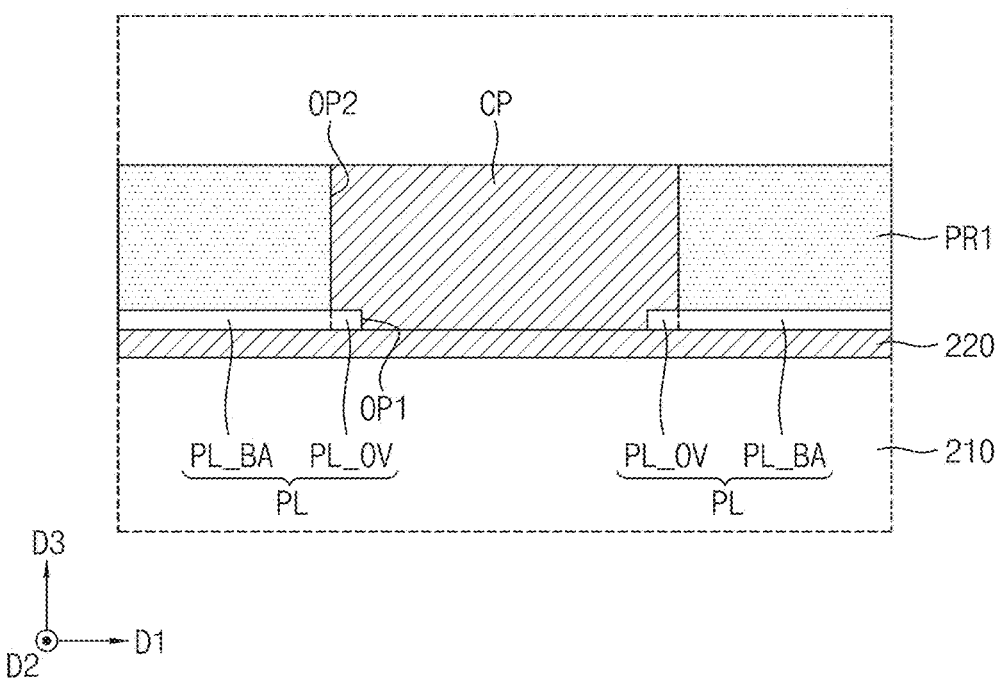

Referring to FIG. 2E, a conductive pattern CP may be formed. In some example embodiments, the conductive pattern CP may be formed through an electroplating process using the seed layer 220. The conductive pattern CP may fill the first opening OP1 of the protection layer PL and the second opening OP2 of the first photoresist pattern PR1. The conductive pattern CP may cover the top surface and the side wall of the overlap portion PL_OV of the protection layer PL. The conductive pattern CP may be formed on the seed layer 220. After formation of the conductive pattern CP, the first photoresist pattern PR1 may be removed.

Figure 2F:
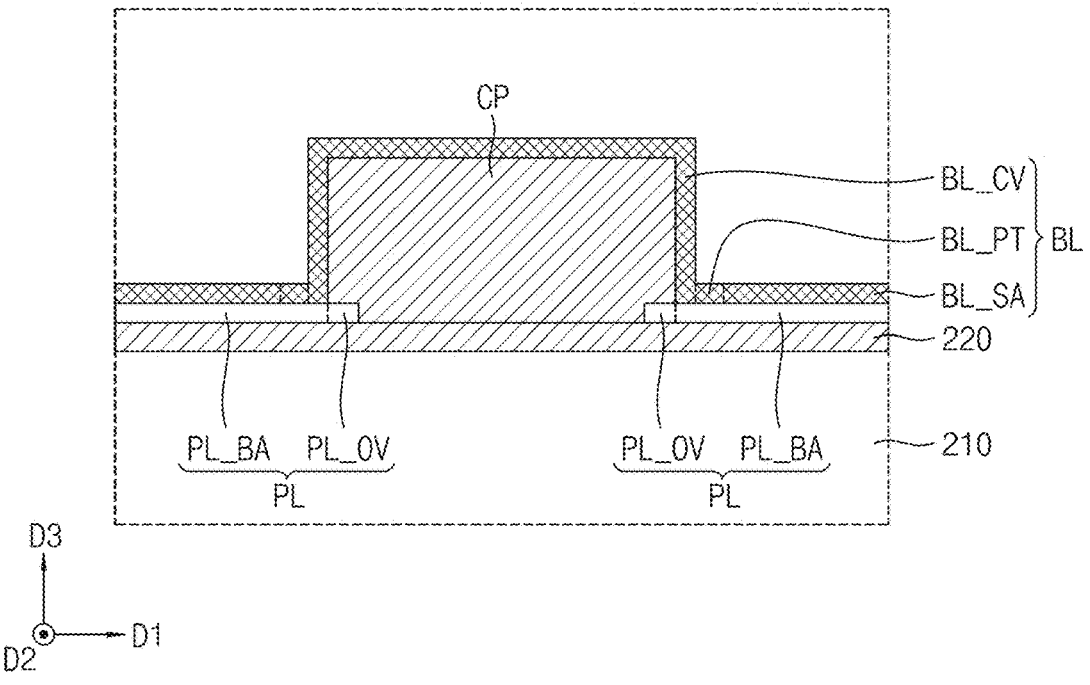

Referring to FIG. 2F, a barrier layer BL may be formed. The barrier layer BL may conformally cover the conductive pattern CP and the base portion PL_BA of the protection layer PL. The barrier layer BL may include a cover portion BL_CV covering the conductive pattern CP, a protrusion portion BL_PT connected to the cover portion BL_CV, and a sacrificial portion BL_SA connected to the protrusion portion BL_PT. The protrusion portion BL_PT of the barrier layer BL may interconnect the cover portion BL_CV and the sacrificial portion BL_SA of the barrier layer BL. The protrusion portion BL_PT and the sacrificial portion BL_SA of the barrier layer BL may be disposed on the base portion BL_BA of the protection layer PL. Although the barrier layer BL is described as being divided into the cover portion BL_CV, the protrusion portion BL_PT and the sacrificial portion BL_SA, for convenience of description, the cover portion BL_CV, the protrusion portion BL_PT and the sacrificial portion BL_SA of the barrier layer BL may be interconnected without having any boundary and, as such, the barrier layer BL may have an integrated structure.

Figure 2G:
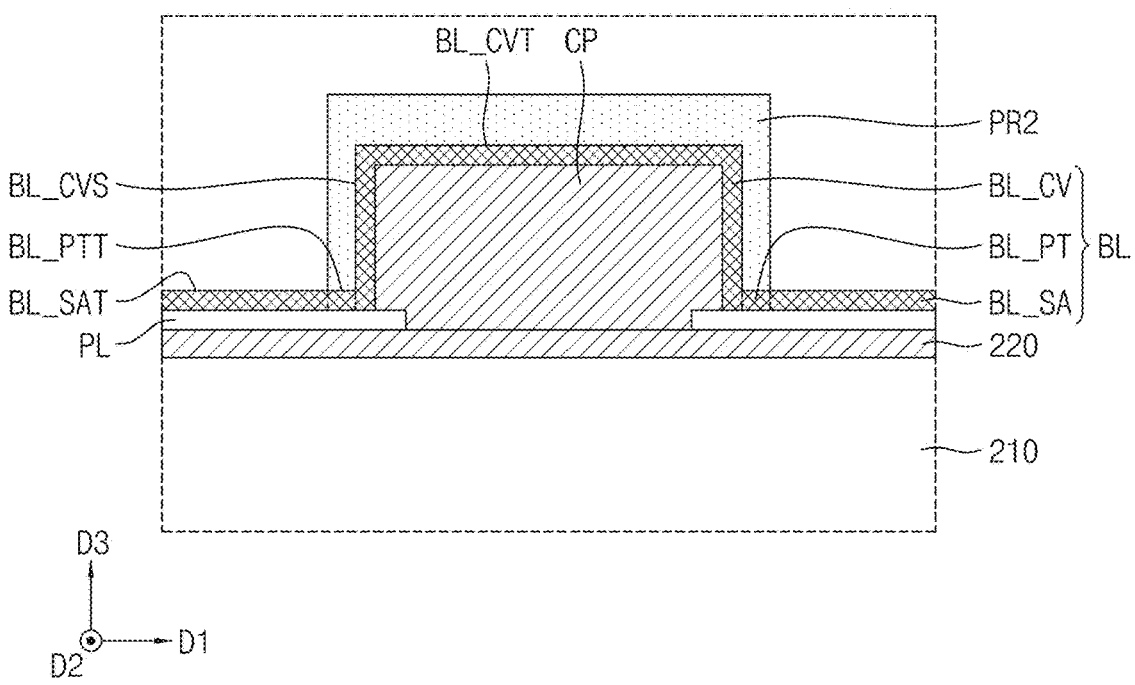

Referring to FIG. 2G, a second photoresist pattern PR2 may be formed on the barrier layer BL. The second photoresist pattern PR2 may cover the cover portion BL_CV and the protrusion portion BL_PT of the barrier layer BL. The second photoresist pattern PR2 may expose the sacrificial portion BL_SA of the barrier layer BL. The second photoresist pattern PR2 may cover a top surface BL_CVT and an outer side wall BL_CVS of the cover portion BL_CV of the barrier layer BL and a top surface BL_PTT of the protrusion portion BL_PT of the barrier layer BL. The second photoresist pattern PR2 may expose a top surface BL_SAT of the sacrificial portion BL_SA of the barrier layer BL.

Figure 2H:
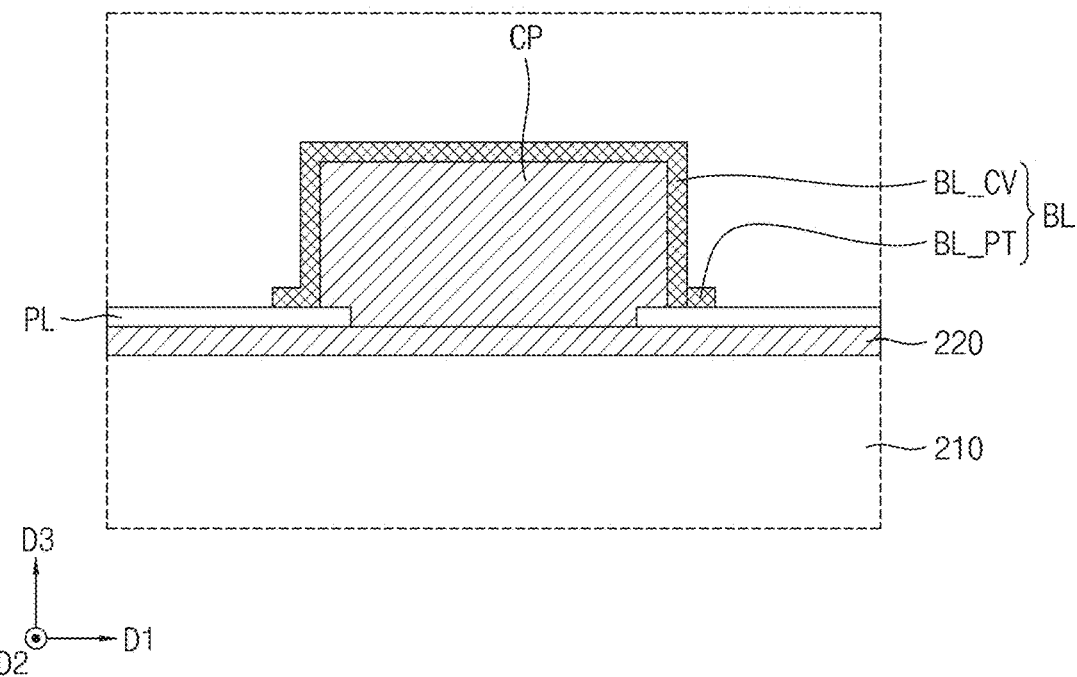
Figure 21:
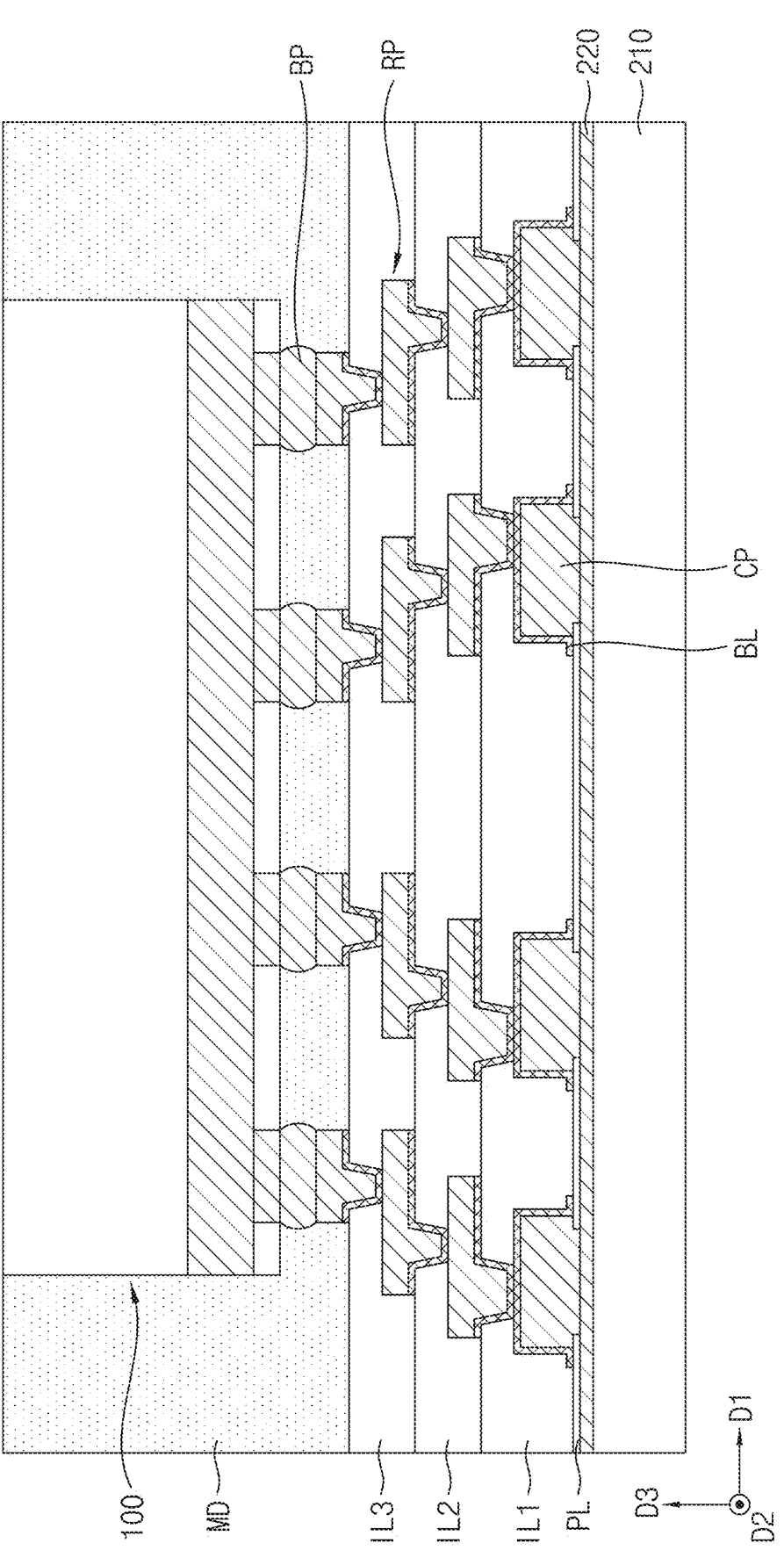

Referring to FIG. 2H, a process of etching the barrier layer BL using the second photoresist pattern PR2 as an etch mask may be performed. In accordance with the etching process, the sacrificial portion BL_SA of the barrier layer BL may be removed. The cover portion BL_CV and the protrusion portion BL_PT of the barrier layer BL may remain. As the barrier layer BL is etched, a top surface of the protection layer PL may be exposed. After the etching process, the second photoresist pattern PR2 may be removed.

Referring to FIG. 2I, a first insulating layer IL1 covering the protection layer PL and the barrier layer BL may be formed. Thereafter, a second insulating layer IL2, a third insulating layer IL3, and/or redistribution patterns RP may be sequentially formed. Bumps BP and a semiconductor chip 100, which are connected to the redistribution patterns RP, may be formed. A molding layer MD surrounding the semiconductor chip 100 may be formed.

Referring to FIG. 1A, the carried substrate 210 and the seed layer 220 may be removed. In some example embodiments, after inversion of the carrier substrate 210, the carrier substrate 210 and the seed layer 220 may be removed. In some example embodiments, the seed layer 220 may be removed by an etching process.

Terminals TE connected to conductive patterns CP may be formed.

In the semiconductor device manufacturing method according to the example embodiments of the disclosure, the protection layer PL covers a bottom surface BL_B of the barrier layer BL and, as such, the barrier layer BL may be protected in a process of removing the seed layer 220. Accordingly, it may be possible to reduce or prevent a phenomenon in which the conductive pattern CP is peeled off due to loss of the barrier layer BL.

The semiconductor device manufacturing method according to the example embodiments of the disclosure forms the conductive pattern CP and the barrier layer BL before formation of the redistribution patterns RP and, as such, it may be possible to reduce costs and/or time of a manufacturing process, as compared to a general chip-last semiconductor package manufacturing method.

Figure 3:
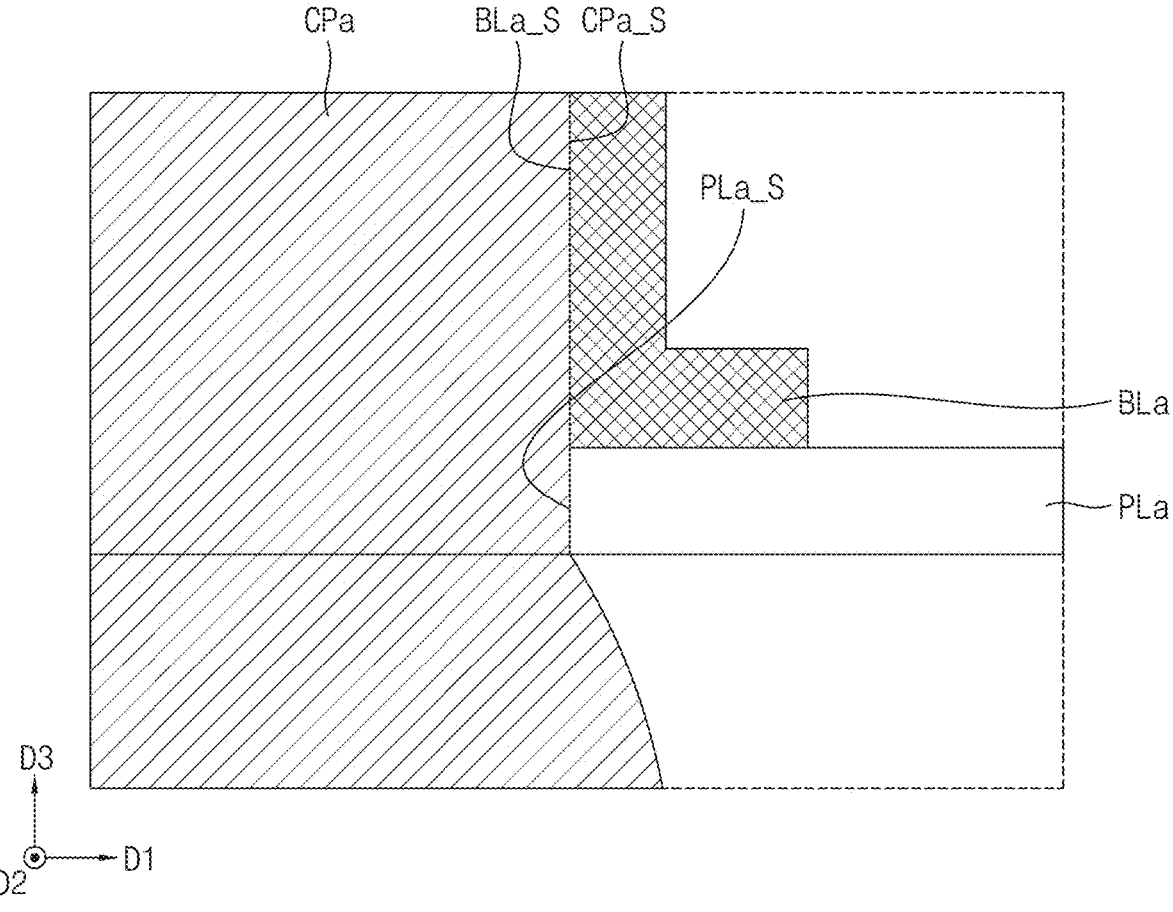
FIG. 3 is an enlarged sectional view of a portion of a semiconductor package according to some example embodiments of the disclosure.

FIG. 3 is an enlarged sectional view of a portion of a semiconductor package according to some example embodiments of the disclosure.

Referring to FIG. 3, a conductive pattern CPa may include a side wall CPa_S contacting a barrier layer BLa and a protection layer PLa. The barrier layer BLa may include an inner side wall BLa_S contacting the side wall CPa_S of the conductive pattern CPa. The protection layer PLa may include a side wall PLa_S contacting the side wall CPa_S of the conductive pattern CPa. The inner side wall BLa_S of the barrier layer BLa and the side wall PLa_S of the protection layer PLa may be coplanar.

Figure 4A:
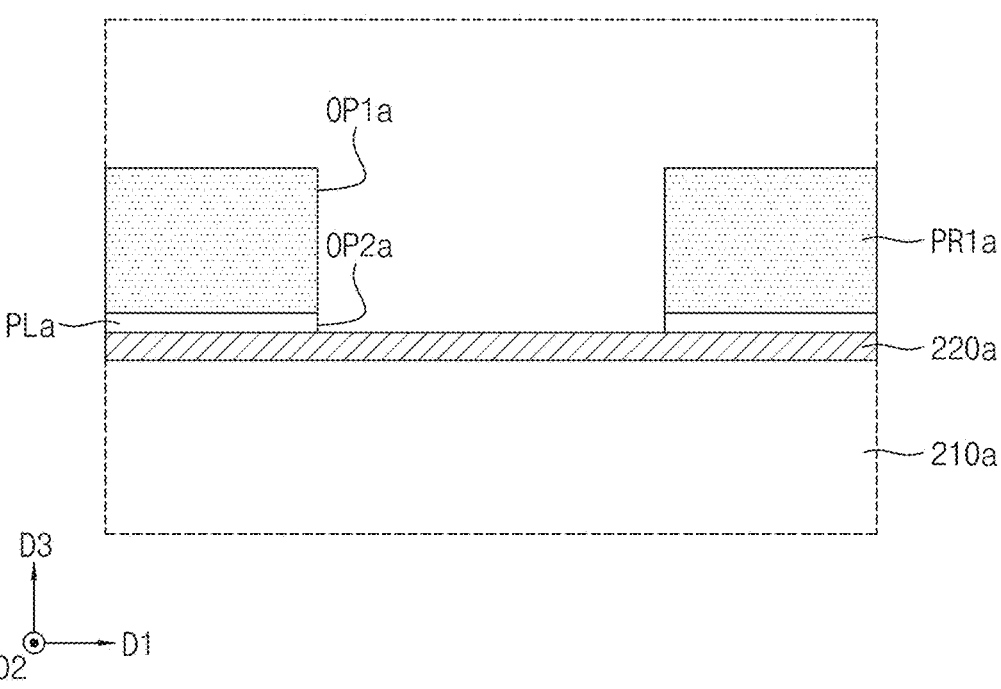
FIGS. 4A and 4B are sectional views explaining a method for manufacturing the semiconductor package according to FIG. 3.
Figure 4B:
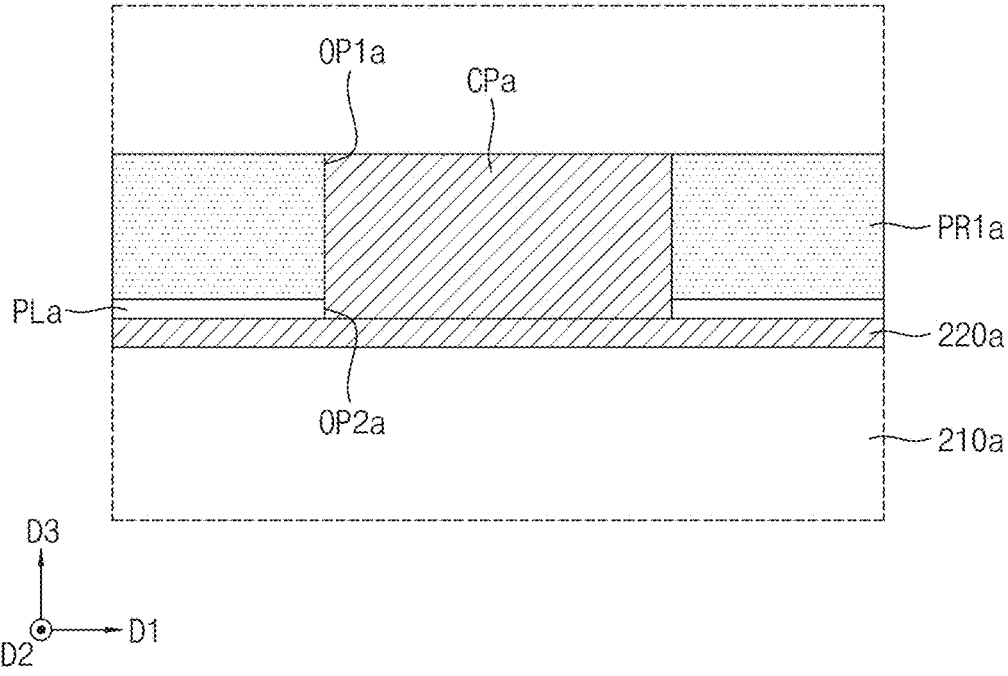

FIGS. 4A and 4B are sectional views explaining a method for manufacturing the semiconductor package according to FIG. 3.

Referring to FIG. 4A, a seed layer 220a may be formed on a carrier substrate 210a, and a protection layer PLa may be formed on the seed layer 220a. In some example embodiments, the protection layer PLa may include a non-photoimageable dielectric.

A first photoresist pattern PR1a including a first opening OP1a may be formed on the protection layer PLa. The first opening OP1a may expose a portion of the protection layer PLa. The protection layer PLa may be etched using the first photoresist pattern PR1a as an etch mask. In accordance with the etching, a portion of the protection layer PLa exposed by the first opening OP1a of the first photoresist pattern PR1a may be removed. As such, a second opening OP2a may be formed at the protection layer PLa.

Referring to FIG. 4B, a conductive pattern CPa may be formed in the first opening OP1a and the second opening OP2a. In some example embodiments, the conductive pattern CPa may be formed by an electroplating process using the seed layer 220a. After formation of the conductive pattern CPa, the first photoresist pattern PR1a may be removed.

Subsequently, other constituent elements of the semiconductor package may be formed, similarly to those described with reference to FIGS. 2F, 2G, 2H, 2I, and 1A.

Figure 5:
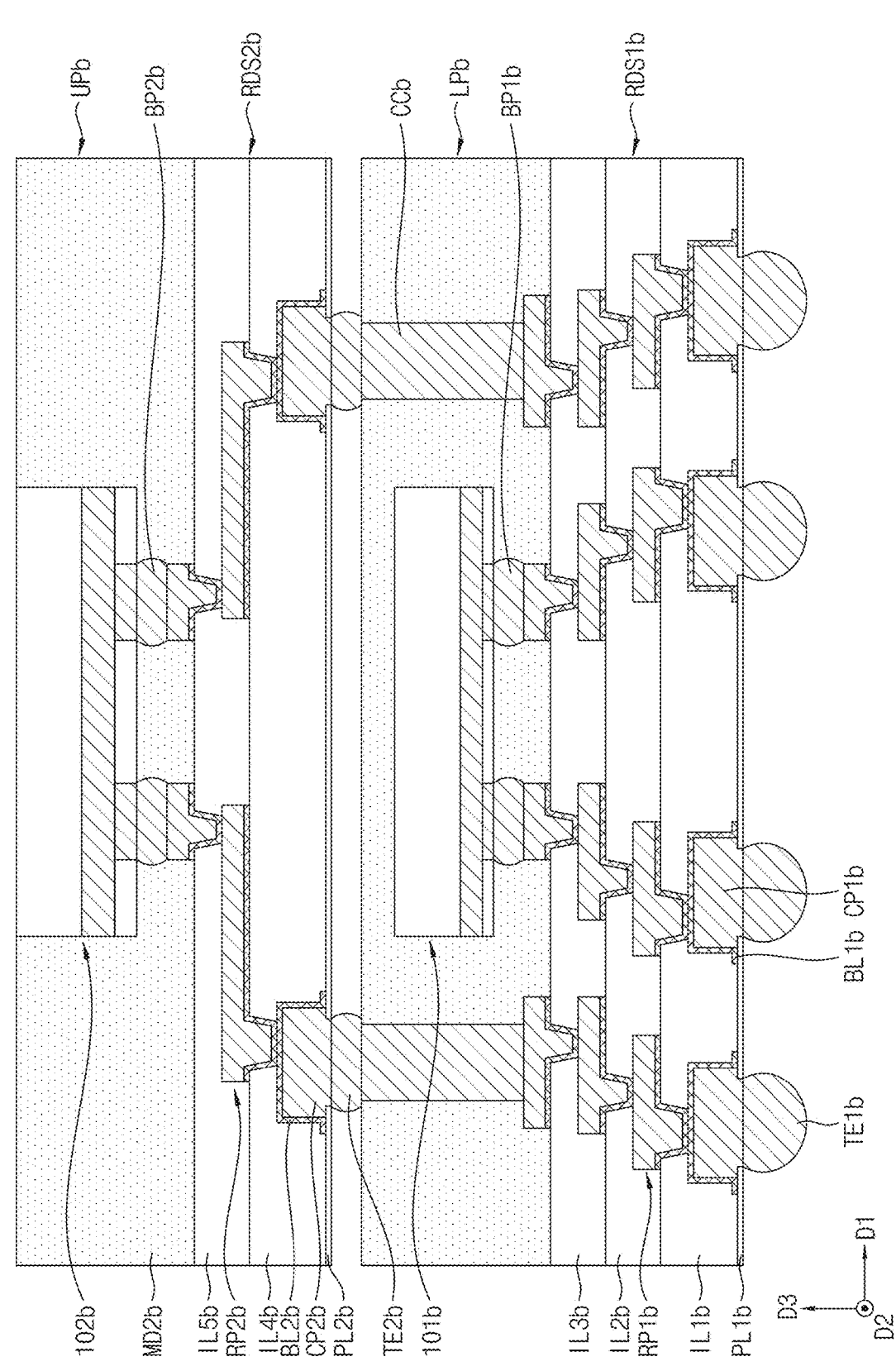
FIG. 5 is a sectional view of a semiconductor package according to some example embodiments of the disclosure.

FIG. 5 is a sectional view of a semiconductor package according to some example embodiments of the disclosure.

Referring to FIG. 5, the semiconductor package may include a lower package LPb and an upper package UPb.

The lower package LPb may include first terminals TE1*b*, a first redistribution structure RDS1*b*, first bumps BP1*b*, a first semiconductor chip 101*b*, a first molding layer MD1*b*, and connecting conductors CCb.

The first redistribution structure RDS1*b* may include a first protection layer PL1*b*, first barrier layers BL1*b*, first conductive patterns CP1*b*, first redistribution patterns RP1*b*, and/or first to third insulating layers IL1*b*, IL2*b*, and IL3*b*. The first semiconductor chip 101*b* and the first redistribution structure RDS1*b* may be interconnected by the first bumps BP1*b*. The connecting conductors CCb may be connected to the first redistribution patterns RP1*b*, respectively. The first molding layer MD1*b* may surround the first semiconductor chip 101*b* and the connecting conductors CCb. The connecting conductors CCb may include a conductive material.

The upper package UPb may include second terminals TE2*b*, a second redistribution structure RDS2*b*, second bumps BP2*b*, a second semiconductor chip 102*b*, and/or a second molding layer MD2*b*.

The second redistribution structure RDS2*b* may include a second protection layer PL2*b*, second barrier layers BL2*b*, second conductive patterns CP2*b*, second redistribution patterns RP2*b*, and/or fourth and fifth insulating layers IL4*b* and IL5*b*. The second semiconductor chip 102*b* and the second redistribution structure RDS2*b* may be interconnected by the second bumps BP2*b*. The second molding layer MD2*b* may surround the second semiconductor chip 102*b*. The second terminal TE2*b* may be connected to the connecting conductor CCb of the lower package LPb. The second terminal TE2*b* may be connected to the second conductive pattern CP2*b* of the second redistribution structure RDS2*b*.

Figure 6:
FIG. 6 is a sectional view of a semiconductor package according to some example embodiments of the disclosure.

FIG. 6 is a sectional view of a semiconductor package according to some example embodiments of the disclosure.

Referring to FIG. 6, the semiconductor package may include a package substrate 300*c*. For example, the package substrate 300*c* may be a printed circuit board (PCB). First terminals TE1*c* electrically connected to the package substrate 300*c* may be provided. The first terminals TE1*c* may be provided under the package substrate 300*c*.

An interposer 400*c* may be provided over the package substrate 300*c*. Second terminals TE2*c* electrically interconnecting the package substrate 300*c* and the interposer 400*c* may be provided. The second terminals TE2*c* may be provided between the package substrate 300*c* and the interposer 400*c*. An underfill layer UNc may be provided between the package substrate 300*c* and the interposer 400*c*.

The interposer 400*c* may include a protection layer PLc, barrier layers BLc, conductive patterns CPc, redistribution patterns RPc, and/or first and second insulating layers IL1*c* and IL2*c*.

A processor chip 500*c* may be provided over the interposer 400*c*. For example, the processor chip 500*c* may be a graphics processing unit (GPU) or a central processing unit (CPU). First bumps BP1*c* interconnecting the processor chip 500*c* and the interposer 400*c* may be provided. The first bumps BP1*c* may be provided between the processor chip 500*c* and the interposer 400*c*.

A first semiconductor chip 101*c* and a second semiconductor chip 102*c* may be sequentially provided over the interposer 400*c* in a third direction D3. The first and second semiconductor chips 101*c* and 102*c* may be spaced apart from the processor chip 500*c* in a first direction D1. The first semiconductor chip 101*c* may be connected to the interposer 400*c* via second bumps BP2*c*. The second bumps BP2*c* may be provided between the first semiconductor chip 101*c* and the interposer 400*c*. The second semiconductor chip 102*c* may be connected to the first semiconductor chip 101*c* via third bumps BP3*c*. The third bumps BP3*c* may be provided between the first semiconductor chip 101*c* and the second semiconductor chip 102*c*.

The first semiconductor chip 101*c* may include a substrate 110*c*, a wiring structure 120*c*, a lower passivation layer 130*c*, lower pads 140*c*, an upper passivation layer 150*c*, upper pads 160*c*, and/or through vias 170*c*. The lower passivation layer 130*c* may function to protect the wiring structure 120*c*. The lower pads 140*c* may extend through the lower passivation layer 130*c* and, as such, may be connected to the interposer 400*c*. The upper passivation layer 150*c* may function to protect the substrate 110*c*. The upper pads 160*c* may be provided on the upper passivation layer 150*c*, and may be connected to the second semiconductor chip 102*c* via the third bumps BP3*c*. The through vias 170*c* may extend through the substrate 110*c* and the upper passivation layer 150*c*. The through via 170*c* may be connected to the wiring structure 120*c* and the upper pad 160*c*. The through vias 170*c* may include a conductive material.

A molding layer MDc surrounding the first and second semiconductor chips 101*c* and 102*c* and the processor chip 500*c* may be provided.

The semiconductor package according to the example embodiments of the disclosure may include a protection layer, thereby protecting a barrier layer, and, as such, it may be possible to reduce or prevent a phenomenon in which a conductive pattern is peeled off. Accordingly, reliability of the semiconductor package may be enhanced.

While the example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A semiconductor package comprising:
   a terminal;
   a conductive pattern connected to the terminal;
   a barrier layer covering a top surface and a first side wall of the conductive pattern;
   an insulating layer surrounding the barrier layer;
   a protection layer covering a bottom surface of the insulating layer and a bottom surface of the barrier layer;
   a redistribution pattern including a redistribution barrier layer directly contacting the barrier layer, and a redistribution conductive layer on the redistribution barrier layer;
   a semiconductor chip electrically connected to the redistribution pattern; and
   a molding layer surrounding the semiconductor chip, wherein
      a portion of an upper surface of the barrier layer is in contact with a lower surface of the redistribution barrier layer, the barrier layer comprises a cover portion covering the top surface and the first side wall of the conductive pattern, and a protrusion portion protruding from the cover portion, a top surface of the protection layer comprises a first portion contacting the conductive pattern, and a second portion contacting the barrier layer, the barrier layer has a vertical inner side wall that contacts the conductive pattern, a vertical side wall of the protection layer contacts the conductive pattern, and the vertical side wall of the protection layer and the vertical inner side wall of the barrier layer are coplanar.

2. The semiconductor package according to claim 1, wherein a side wall of the protection layer contacts the conductive pattern.

3. The semiconductor package according to claim 1, wherein:

the conductive pattern comprises a first bottom surface contacting the first portion of the top surface of the protection layer, and a second bottom surface contacting the terminal; and a level of the first bottom surface of the conductive pattern is higher than a level of the second bottom surface of the conductive pattern.

4. The semiconductor package according to claim 3, wherein the conductive pattern comprises a second side wall contacting the protection layer.

5. The semiconductor package according to claim 4, wherein the second side wall of the conductive pattern interconnects the first bottom surface of the conductive pattern and the second bottom surface of the conductive pattern.

6. The semiconductor package according to claim 3, wherein the second bottom surface of the conductive pattern is coplanar with a bottom surface of the protection layer.

7. A semiconductor package comprising:

a protection layer;

a conductive pattern extending through the protection layer;

a barrier layer covering a top surface and a side wall of the conductive pattern;

an insulating layer on the protection layer; and a redistribution pattern connected to the barrier layer, wherein the barrier layer has a vertical inner side wall that contacts the conductive pattern, and a vertical side wall of the protection layer contacts the conductive pattern, and the vertical side wall of the protection layer and the vertical inner side wall of the barrier layer are coplanar.

8. The semiconductor package according to claim 7, wherein a thickness of the protection layer is 0.1 to 0.3 μm.

9. The semiconductor package according to claim 7, wherein the barrier layer comprises a cover portion covering the top surface and the side wall of the conductive pattern, and a protrusion portion protruding from the cover portion.

10. The semiconductor package according to claim 9, wherein:

an outer side wall of the cover portion and an outer side wall of the protrusion portion are spaced apart from each other; and a top surface of the protrusion portion interconnects the outer side wall of the cover portion and the outer side wall of the protrusion portion.

11. The semiconductor package according to claim 7, further comprising:

a bump connected to the redistribution pattern; and a semiconductor chip connected to the bump.

12. The semiconductor package according to claim 7, wherein the redistribution pattern comprises a redistribution barrier layer contacting the barrier layer, and a redistribution conductive layer on the redistribution barrier layer.

13. A semiconductor package comprising:

a first terminal;

a first conductive pattern connected to the first terminal;

a first barrier layer surrounding the first conductive pattern, wherein the first barrier layer has a vertical inner side wall that contacts a side wall of the first conductive pattern;

a first insulating layer covering the first barrier layer;

a first protection layer covering a bottom surface of the first barrier layer and a bottom surface of the first insulating layer, wherein a vertical side wall of the first protection layer contacts the side wall of the first conductive pattern, and the vertical side wall of the first protection layer and the vertical inner side wall of the first barrier layer are coplanar;

a first redistribution pattern connected to the first barrier layer; and a first semiconductor chip electrically connected to the first redistribution pattern, wherein the first barrier layer comprises a first cover portion covering a top surface and the side wall of the first conductive pattern, and a first protrusion portion protruding from the first cover portion, wherein the first cover portion covering the top surface of the first conductive pattern is planar and the first cover portion covering the side wall of the first conductive pattern is planar, and wherein an outer side wall of the first cover portion and an outer side wall of the first protrusion portion are spaced apart from each other.

14. The semiconductor package according to claim 13, further comprising:

a connecting conductor connected to the first terminal;

a second redistribution pattern connected to the connecting conductor;

a second barrier layer connected to the second redistribution pattern;

a second insulating layer surrounding the second barrier layer;

a second protection layer covering a bottom surface of the second barrier layer and a bottom surface of the second insulating layer;

a second conductive pattern surrounded by the second barrier layer; and a second terminal connected to the second conductive pattern.

15. The semiconductor package according to claim 14, wherein:

the second barrier layer comprises a second cover portion covering a top surface and a side wall of the second conductive pattern, and a second protrusion portion protruding from the second cover portion; and an outer side wall of the second cover portion is spaced apart from an outer side wall of the second protrusion portion.

16. The semiconductor package according to claim 13, further comprising:

a processor chip connected to the first redistribution pattern and spaced apart from the first semiconductor chip; and a printed circuit board connected to the first terminal.

* * * * *